(12) United States Patent
Christiansen et al.

(10) Patent No.: US 7,592,067 B2
(45) Date of Patent: Sep. 22, 2009

(54) EPOXY RESIN COMPOSITIONS, PROCESSES UTILIZING SAME AND ARTICLES MADE THEREFROM

(75) Inventors: Walter H. Christiansen, Richmond, TX (US); Larry S. Corley, Houston, TX (US); Carlton E. Ash, Sugarland, TX (US)

(73) Assignee: Hexion Specialty Chemicals, Inc., Columbus, OH (US)

(*) Notice: Subject to any disclaimer, the term of this patent is extended or adjusted under 35 U.S.C. 154(b) by 0 days.

(21) Appl. No.: 10/667,648

(22) Filed: Sep. 22, 2003

(65) Prior Publication Data

US 2005/0065295 A1    Mar. 24, 2005

(51) Int. Cl.
- B32B 27/38 (2006.01)
- B32B 27/04 (2006.01)
- B32B 27/26 (2006.01)
- B05D 1/00 (2006.01)
- C08L 63/00 (2006.01)

(52) U.S. Cl. .................. 428/413; 428/297.4; 428/396; 427/386; 427/388.1; 427/389.7; 427/389.8; 427/389.9; 427/393.3

(58) Field of Classification Search ............. 428/297.4, 428/311.11, 396, 413, 414, 415, 416, 417, 428/418; 523/400, 457
See application file for complete search history.

(56) References Cited

U.S. PATENT DOCUMENTS

| | | |
|---|---|---|
| 2,510,886 A | 6/1950 | Greenlee |
| 2,589,245 A | 3/1952 | Greenlee |
| 2,865,886 A | 12/1958 | Greenlee |
| 3,306,872 A | 2/1967 | Maycock et al. |
| 3,452,116 A * | 6/1969 | Schwarzer .................. 525/527 |
| 3,687,894 A | 8/1972 | Collings et al. |
| 4,168,331 A | 9/1979 | Davis |
| 4,168,364 A * | 9/1979 | Seltzer et al. ................. 528/88 |
| 4,251,594 A | 2/1981 | Davis et al. |
| 4,284,574 A * | 8/1981 | Bagga ......................... 549/555 |
| 4,327,143 A * | 4/1982 | Alvino et al. ............... 442/180 |
| 4,393,181 A * | 7/1983 | Allen .......................... 525/504 |
| 4,503,200 A * | 3/1985 | Corley ........................ 525/532 |
| 4,554,341 A * | 11/1985 | Allen ........................... 528/89 |
| 4,895,755 A | 1/1990 | Berman et al. |
| 5,081,206 A | 1/1992 | Yasuda et al. |
| 5,304,662 A * | 4/1994 | Thoseby et al. ............. 549/556 |
| 5,380,804 A | 1/1995 | Lees et al. |
| 5,534,565 A | 7/1996 | Zupancic et al. |
| 5,958,593 A * | 9/1999 | Shomer ...................... 428/413 |
| 6,255,365 B1 | 7/2001 | Hayakawa |
| 6,344,520 B1 * | 2/2002 | Greene ....................... 525/100 |
| 6,451,878 B1 | 9/2002 | Fukuzawa et al. |

FOREIGN PATENT DOCUMENTS

EP    0083813    *    7/1983

* cited by examiner

Primary Examiner—Michael J Feely

(57) ABSTRACT

Disclosed are epoxy resin compositions which include an alkali metal containing cure accelerator. The alkali metal containing cure accelerators are preferably alkali metal hydroxides, alkoxides, carboxylates, or alkali metal salts. Articles prepared from the resin compositions of the invention exhibit enhanced thermal properties, and similar non-thermal properties, when compared to articles prepared from compositions including other accelerators such as imidazoles. The resin compositions of the invention may be used for any purpose, but are particularly suited to be utilized in the manufacture of laminates for printed circuit boards and non-electrical structural applications.

20 Claims, No Drawings

EPOXY RESIN COMPOSITIONS, PROCESSES UTILIZING SAME AND ARTICLES MADE THEREFROM

FIELD OF THE INVENTION

The present invention relates to cure accelerators for epoxy resin compositions, to epoxy resin compositions comprising these cure accelerators, to processes utilizing these cure accelerators and to articles made therefrom. Specifically, the invention relates to utilizing an alkali metal containing compound as a cure accelerator and more specifically to an accelerated resin varnish including same. The alkali metal containing cure accelerators are preferably alkali metal hydroxides, alkoxides, carboxylates or alkali metal halide salts. Articles prepared from the resin compositions of the invention exhibit enhanced thermal properties when compared to articles prepared from comparable compositions which include other accelerators, such as for example, imidazoles. In addition, articles prepared from the resin compositions of the invention exhibit similar non-thermal properties when compared to articles prepared from such comparable compositions. The resin compositions of the invention may be used for any purpose, but are particularly suited to be utilized in the manufacture of laminates for printed circuit boards and non-electrical structural applications.

BACKGROUND OF THE INVENTION

Articles prepared from resin compositions which have improved resistance to elevated temperatures are desirable for many applications. In particular these articles, having improved elevated temperature resistance, are desirable for printed circuit board applications due to industry trends which include higher circuit densities, increased board thickness, lead free solders, and higher temperature use environments.

Articles such as laminates, and particularly structural and electrical copper clad laminates, are generally manufactured by pressing, under elevated temperatures and pressures, various layers of partially cured prepregs and optionally copper sheeting. Prepregs are generally manufactured by impregnating a thermosettable epoxy resin composition into a porous substrate, such as a glass fiber mat, followed by processing at elevated temperatures to promote a partial cure of the epoxy resin in the mat to a "B-stage." Complete cure of the epoxy resin impregnated in the glass fiber mat typically occurs during the lamination step when the prepreg layers are pressed under high pressure and elevated temperatures for a time sufficient to allow for complete cure of the resin.

Epoxy resin compositions which impart enhanced thermal properties are desirable in the manufacture of prepregs and laminates. Such systems offer improved heat resistance and reduced thermal expansion required for complex printed circuit board circuitry and for higher fabrication and usage temperatures. However, such resin compositions are typically more expensive to formulate and may suffer from inferior performance capabilities.

U.S. Pat. Nos. 6,451,878 and 5,081,206, for example, disclose the use of several advancement or upstaging catalysts, including alkali metal hydroxides, for the reaction between an epoxy group and a phenolic hydroxyl group for the preparation of higher molecular weight epoxides.

U.S. Pat. No. 5,380,804 discloses curable compositions which employ 1,3,5-tris-(2-carboxyethyl)isocyanurate crosslinker and an optional cure catalyst which may include phosphines, phosphates, amines, oxides, alkoxides, such as methoxide or ethoxide, hydroxides, such as sodium hydroxide or potassium hydroxide, carbonates, carboxylic salts, quaternary salts and the like.

U.S. Pat. No. 4,251,594 discloses an improvement for the preparation of electrical laminates in utilizing an alkali metal hydroxide as a catalyst for epoxy-phenolic hydroxyl fusion reaction.

U.S. Pat. No. 2,589,245 discloses complex amide-epoxide compositions and that alkaline and Friedel-Crafts type catalysts, including sodium hydroxide, potassium hydroxide and sodium phenoxide, are active in promoting the reaction of epoxide groups with amines.

However, the prior art does not teach or suggest the use of alkali metal containing compounds as an accelerator which may be used with curing agents for the cure of epoxy compounds to produce laminates, for printed circuit boards and non-electrical structural applications, having enhanced thermal properties.

In light of the above, there is a need in the art for epoxy resin compositions for preparing articles having improved thermal properties and for processes to produce them. There is also a need in the art for inexpensive resin compositions for achieving enhanced thermal properties and for articles, especially prepregs, having enhanced thermal properties.

SUMMARY OF THE INVENTION

In one embodiment, the invention provides for a process for preparing a resin coated article. The process steps include contacting a substrate with an accelerated resin composition which includes an epoxy resin, a curing agent, and an alkali metal containing cure accelerator compound. In another embodiment, the invention provides for articles, especially prepregs, prepared by the process of the invention.

DETAILED DESCRIPTION OF THE INVENTION

The epoxy resin composition of the present invention includes at least one epoxy resin component, at least one curing agent, at least one alkali metal containing accelerator, and optionally one or more solvents.

A. Epoxy Resin Component

The epoxy resin compositions of the invention include at least one epoxy resin component. Epoxy resins are those compounds containing at least one vicinal epoxy group. The epoxy resin may be saturated or unsaturated, aliphatic, cycloaliphatic, aromatic or heterocyclic and may be substituted. The epoxy resin may also be monomeric or polymeric.

The epoxy resin compound utilized may be, for example, an epoxy resin or a combination of epoxy resins prepared from an epihalohydrin and a phenol or a phenol type compound, prepared from an epihalohydrin and an amine, prepared from an epihalohydrin and a carboxylic acid, or prepared from the oxidation of unsaturated compounds.

In one embodiment, the epoxy resins utilized in the compositions of the present invention include those resins produced from an epihalohydrin and a phenol or a phenol type compound. The phenol type compound includes compounds having an average of more than one aromatic hydroxyl group per molecule. Examples of phenol type compounds include dihydroxy phenols, biphenols, bisphenols, halogenated biphenols, halogenated bisphenols, hydrogenated bisphenols, alkylated biphenols, alkylated bisphenols, trisphenols, phenol-aldehyde resins, novolac resins (i.e. the reaction product of phenols and simple aldehydes, preferably formaldehyde), halogenated phenol-aldehyde novolac resins, substituted phenol-aldehyde novolac resins, phenol-hydrocarbon resins, substituted phenol-hydrocarbon resins, phenol-hydroxybenzaldehyde resins, alkylated phenol-hydroxybenzaldehyde resins, hydrocarbon-phenol resins, hydrocarbon-halogenated phenol resins, hydrocarbon-alkylated phenol resins, or combinations thereof.

In another embodiment, the epoxy resins utilized in the compositions of the invention preferably include those resins produced from an epihalohydrin and bisphenols, halogenated bisphenols, hydrogenated bisphenols, novolac resins, and polyalkylene glycols, or combinations thereof.

In another embodiment, the epoxy resin compounds utilized in the compositions of the invention preferably include those resins produced from an epihalohydrin and resorcinol, catechol, hydroquinone, biphenol, bisphenol A, bisphenol AP (1,1-bis(4-hydroxyphenyl)-1-phenyl ethane), bisphenol F, bisphenol K, tetrabromobisphenol A, phenol-formaldehyde novolac resins, alkyl substituted phenol-formaldehyde resins, phenol-hydroxybenzaldehyde resins, cresol-hydroxybenzaldehyde resins, dicyclopentadiene-phenol resins, dicyclopentadiene-substituted phenol resins, tetramethylbiphenol, tetramethyl-tetrabromobiphenol, tetramethyltribromobiphenol, tetrachlorobisphenol A, or combinations thereof.

The preparation of such compounds is well known in the art. See Kirk-Othmer, Encyclopedia of Chemical Technology, 3rd Ed., Vol. 9, pp 267-289. Examples of epoxy resins and their precursors suitable for use in the compositions of the invention are also described, for example, in U.S. Pat. Nos. 5,137,990 and 6,451,898 which are incorporated herein by reference.

In another embodiment, the epoxy resins utilized in the compositions of the present invention include those resins produced from an epihalohydrin and an amine. Suitable amines include diaminodiphenylmethane, aminophenol, xylene diamine, anilines, and the like, or combinations thereof.

In another embodiment, the epoxy resins utilized in the compositions of the present invention include those resins produced from an epihalohydrin and a carboxylic acid. Suitable carboxylic acids include phthalic acid, isophthalic acid, terephthalic acid, tetrahydro- and/or hexahydrophthalic acid, endomethylenetetrahydrophthalic acid, isophthalic acid, methylhexahydrophthalic acid, and the like or combinations thereof.

In another embodiment, the epoxy resin compounds utilized in the compositions of the invention include those resins produced from an epihalohydrin and compounds having at least one aliphatic hydroxyl group. In this embodiment, it is understood that such resin compositions produced contain an average of more than one aliphatic hydroxyl groups. Examples of compounds having at least one aliphatic hydroxyl group per molecule include aliphatic alcohols, aliphatic diols, polyether diols, polyether triols, polyether tetrols, any combination thereof and the like. Also suitable are the alkylene oxide adducts of compounds containing at least one aromatic hydroxyl group. In this embodiment, it is understood that such resin compositions produced contain an average of more than one aromatic hydroxyl groups. Examples of oxide adducts of compounds containing at least one aromatic hydroxyl group per molecule include ethylene oxide, propylene oxide, or butylene oxide adducts of dihydroxy phenols, biphenols, bisphenols, halogenated bisphenols, alkylated bisphenols, trisphenols, phenol-aldehyde novolac resins, halogenated phenol-aldehyde novolac resins, alkylated phenol-aldehyde novolac resins, hydrocarbon-phenol resins, hydrocarbon-halogenated phenol resins, or hydrocarbon-alkylated phenol resins, or combinations thereof.

In another embodiment the epoxy resin refers to an advanced epoxy resin which is the reaction product of one or more epoxy resins components, as described above, with one or more phenol type compounds and/or one or more compounds having an average of more than one aliphatic hydroxyl group per molecule as described above. Alternatively, the epoxy resin may be reacted with a carboxyl substituted hydrocarbon, which is described herein as a compound having a hydrocarbon backbone, preferably a $C_1$-$C_{40}$ hydrocarbon backbone, and one or more carboxyl moieties, preferably more than one, and most preferably two. The $C_1$-$C_{40}$ hydrocarbon backbone may be a straight- or branched-chain alkane or alkene, optionally containing oxygen. Fatty acids and fatty acid dimers are among the useful carboxylic acid substituted hydrocarbons. Included in the fatty acids are caproic acid, caprylic acid, capric acid, octanoic acid, VERSATIC™ acids, available from Resolution Performance Products LLC, Houston, Tex., decanoic acid, lauric acid, myristic acid, palmitic acid, stearic acid, palmitoleic acid, oleic acid, linoleic acid, linolenic acid, erucic acid, pentadecanoic acid, margaric acid, arachidic acid, and dimers thereof.

In another embodiment, the epoxy resin is the reaction product of a polyepoxide and a compound containing more than one isocyanate moiety or a polyisocyanate. Preferably the epoxy resin produced in such a reaction is an epoxy-terminated polyoxazolidone.

B. Curing Agents

In one embodiment, the curing agents utilized in the compositions of the invention include amine- and amide-containing curing agents having, on average, more than one active hydrogen atom, wherein the active hydrogen atoms may be bonded to the same nitrogen atom or to different nitrogen atoms. Examples of suitable curing agents include those compounds that contain a primary amine moiety, and compounds that contain two or more primary or secondary amine or amide moieties linked to a common central organic moiety. Examples of suitable amine-containing curing agents include ethylene diamine, diethylene triamine, polyoxypropylene diamine, triethylene tetramine, dicyandiamide, melamine, cyclohexylamine, benzylamine, diethylaniline, methylenedianiline, m-phenylenediamine, diaminodiphenylsulfone, 2,4 bis(p-aminobenzyl)aniline, piperidine, N,N-diethyl-1,3-propane diamine, and the like, and soluble adducts of amines and polyepoxides and their salts, such as described in U.S. Pat. Nos. 2,651,589 and 2,640,037.

In another embodiment, polyamidoamines may be utilized as a curing agent in the resin compositions of the invention. Polyamidoamines are typically the reaction product of a polyacid and an amine. Examples of polyacids used in making these polyamidoamines include 1,10-decanedioic acid, 1,12-dodecanedioic acid, 1,20-eicosanedioic acid, 1,14-tetradecanedioic acid, 1,18-octadecanedioic acid and dimerized and trimerized fatty acids. Amines used in making the polyamidoamines include aliphatic and cycloaliphatic polyamines such as ethylene diamine, diethylene triamine, triethylene tetramine, tetraethylene pentamine, 1,4-diaminobutane, 1,3-diaminobutane, hexamethylene diamine, 3-(N-isopropylamino)propylamine and the like. In another embodiment, polyamides are those derived from the aliphatic polyamines containing no more than 12 carbon atoms and polymeric fatty acids obtained by dimerizing and/or trimerizing ethylenically unsaturated fatty acids containing up to 25 carbon atoms.

In another embodiment, the curing agents are aliphatic polyamines, polyglycoldiamines, polyoxypropylene diamines, polyoxypropylenetriamines, amidoamines, imidazoles, reactive polyamides, ketimines, araliphatic polyamines (i.e. xylylenediamine), cycloaliphatic amines (i.e. isophoronediamine or diaminocyclohexane), menthane diamine, 4,4-diamino-3,3-dimethyldicyclohexylmethane, heterocyclic amines (aminoethyl piperazine), aromatic polyamines (methylene dianiline), diamino diphenyl sulfone, mannich base, phenalkamine, N,N',N"-tris(6-aminohexyl) melamine, and the like. In another embodiment, imidazoles, which may be utilized as an accelerator for a curing agent, may also be utilized as a curing agent.

In another embodiment, the curing agent is a phenolic curing agent which includes compounds having an average of one or more phenolic groups per molecule. Suitable phenol curing agents include dihydroxy phenols, biphenols, bisphenols, halogenated biphenols, halogenated bisphenols, hydrogenated bisphenols, alkylated biphenols, alkylated bisphenols, trisphenols, phenol-aldehyde resins, phenol-aldehyde novolac resins, halogenated phenol-aldehyde novolac resins, substituted phenol-aldehyde novolac resins, phenol-hydrocarbon resins, substituted phenol-hydrocarbon resins, phenol-hydroxybenzaldehyde resins, alkylated phenol-hydroxybenzaldehyde resins, hydrocarbon-phenol resins, hydrocarbon-halogenated phenol resins, hydrocarbon-alkylated phenol resins, or combinations thereof. Preferably, the phenolic curing agent includes substituted or unsubstituted phenols, biphenols, bisphenols, novolacs or combinations thereof.

In another embodiment, the curing agent is a polybasic acid or its corresponding anhydride. Examples of polybasic acids include di-, tri-, and higher carboxylic acids, such as, oxalic acid, phthalic acid, terephthalic acid, succinic acid, alkyl and alkenyl-substituted succinic acids and tartaric acid. Examples also include polymerized unsaturated acids, for example, those containing at least 10 carbon atoms, and preferably more than 14 carbon atoms, such as, dodecenedioic acid, and 10,12-eicosadienedioic acid. Examples of suitable anhydrides include phthalic anhydride, succinic anhydride, maleic anhydride, nadic anhydride, nadic methyl anhydride, pyromellitic anhydride, trimellitic anhydride and the like. Other types of acids that are useful are those containing sulfur, nitrogen, phosphorus or halogens; chlorendic acid, benzene phosphonic acid, and sulfonyl dipropionic acid bis(4-carboxyphenyl)amide.

The ratio of curing agent to epoxy resin is preferably suitable to provide a fully cured resin. The amount of curing agent which may be present may vary depending upon the particular curing agent used (due to the cure chemistry and curing agent equivalent weight) as is known in the art.

C. Alkali Metal Containing Accelerator Compounds

The accelerators of the invention include those alkali metal containing compounds which catalyze the reaction of the epoxy resin with the curing agent. The alkali metal compound of the invention acts with curing agent to form an infusible reaction product between the curing agent and the epoxy resin in a final article of manufacture such as a structural composite or laminate. By an infusible reaction product, it is meant that the epoxy resin has essentially completely cured, which for example may be at a time when there is little or no change between two consecutive $T_g$ measurements ($\Delta T_g$).

In one embodiment, the alkali metal containing compound is an alkali metal hydroxide or alkoxide. In another embodiment, the alkali metal containing compound is represented by the formulae:

  Formula 1a or

  Formula 1b

In each of Formula 1a and 1b, M is a metal selected from Group 1 of the Periodic Table of the Elements. In another embodiment, M is lithium, sodium or potassium. In another embodiment M is sodium or potassium. In another embodiment M is potassium. O is oxygen. R is hydrogen or a substituted or unsubstituted hydrocarbyl group. n is an integer, preferably n is 1 to 50 or 1 to 20.

The term "hydrocarbyl" encompasses all groups containing only carbon and hydrogen atoms including alkyl, alkenyl, alkynyl, aryl, arylalkyl, arylalkenyl and alkylaryl groups. Preferred hydrocarbyl groups comprise 1 to 40, 1 to 20, 1 to 12 or 1 to 6 carbon atoms. Substituted means that at least one hydrogen atom on a group is replaced with a hydrocarbyl, halide, halocarbyl, alkylamido, alkoxy, siloxy, aryloxy, alkylthio, arylthio, dialkylamino, dialkylphosphino, or other substituents.

The term "alkyl", means a straight-chain, branched-chain or cyclic alkyl group. Examples of such groups include, but are not limited to, methyl, ethyl, n-propyl, isopropyl, n-butyl, isobutyl, sec-butyl, tert-butyl, pentyl, iso-amyl, hexyl, 2-ethylhexyl, octyl, cyclopentyl, cyclohexyl and the like. The cyclic alkyl groups may be substituted with one or more straight-chain and/or branched-chain alkyl groups (i.e., may be alkylcycloalkyl groups such as, e.g., methylcyclohexyl etc.). Conversely, the straight-chain and branched-chain alkyl groups may be substituted with one or more cyclic alkyl groups (i.e., may be cycloalkylalkyl groups such as cyclohexylmethyl etc.). Moreover, unless indicated otherwise, the above alkyl groups may be substituted by one or more groups independently selected from halogen (e.g., F, Cl, Br) alkoxy (e.g., methoxy, ethoxy, propoxy, butoxy and the like), hydroxy, amino, monoalkylamino (e.g., methylamino, ethylamino, propylamino and the like) and dialkylamino (e.g., dimethylamino, diethylamino, dipropylamino, diisopropylamino, piperidino and the like) and trihydrocarbylsilyl (e.g., trimethylsilyl, triphenylsilyl and the like). Unless otherwise stated, the above definition of the term "alkyl" also applies to groups comprising one or more alkyl groups.

The term "alkenyl" means "alkyl" as defined above having one or more double bonds, and the term "alkynyl" means "alkyl" as defined above having one or more triple bonds. Examples of alkenyl groups include, but are not limited to, ethenyl, propenyl, allyl, butenyl, 1,4-butadienyl, isopropenyl, cyclopentenyl, cyclohexenyl, cyclooctenyl, cyclopentadienyl, cyclohexadienyl, cyclooctadienyl and the like.

The term "aryl" means an aromatic group, which optionally may contain one or more heteroatoms (preferably selected from N, O and S and combinations thereof) in the ring. Illustrative, non-limiting examples of aryl groups are phenyl, naphthyl, fluorenyl, chlorophenyl, dichlorophenyl, fluorophenyl, perfluorophenyl, hydroxyphenyl, anisyl, biphenyl, nitrophenyl, acetylphenyl, aminophenyl, pyridyl, pyridazyl, quinolyl, and the like. Unless otherwise stated, the above definition of the term "aryl" also applies to groups which comprise one or more aryl groups. For example, the term "aryloxy" means an aryl ether group wherein the term "aryl" is as defined above.

The term "alkoxy" means an alkyl or alkenyl ether group wherein the terms "alkyl" and "alkenyl" are as defined above. Examples of suitable alkyl ether groups include, but are not limited to, methoxy, ethoxy, n-propoxy, isopropoxy, n-butoxy, iso-butoxy, sec-butoxy, tert-butoxy, phenoxy, allyloxy, trifluoromethoxy and the like.

The term "halogen" means fluorine, chlorine, bromine and iodine.

In one embodiment, referring to Formula 1a or 1b, M is lithium, sodium or potassium, or M is sodium or potassium, and R is hydrogen or an alkyl group, preferably a $C_1$ to $C_{40}$ alkyl group, a $C_1$ to $C_{20}$ alkyl group, or a $C_1$ to $C_6$ alkyl group. In another embodiment M is sodium or potassium and the group OR represents a methoxy, ethoxy, n-propoxy, isopropoxy, n-butoxy, iso-butoxy, sec-butoxy, tert-butoxy, or phenoxy group. In another embodiment, the alkali metal containing accelerator compound is sodium hydroxide, potassium hydroxide, lithium hydroxide, sodium methoxide, potassium methoxide, lithium methoxide, or combinations thereof.

In one embodiment Formula 1a or 1b refers to an alkali metal phenoxide formed from a phenolic or a polyphenolic compound. Examples of phenolic compounds and polyphenolic compounds include phenols, dihydroxy phenols, biphenols, bisphenols, halogenated biphenols, halogenated bisphenols, hydrogenated bisphenols, alkylated biphenols, alkylated bisphenols, trisphenols, phenol-aldehyde resins, novolac resins (i.e. the reaction product of phenols and simple aldehydes, preferably formaldehyde), halogenated phenol-aldehyde novolac resins, substituted phenol-aldehyde novolac resins, phenol-hydrocarbon resins, substituted phenol-hydrocarbon resins, phenol-hydroxybenzaldehyde resins, alkylated phenol-hydroxybenzaldehyde resins, hydrocarbon-phenol resins, hydrocarbon-halogenated phenol resins, hydrocarbon-alkylated phenol resins, or combinations thereof.

In one embodiment, the alkali metal containing compound is an alkali metal carboxylate. In another embodiment, the alkali metal containing compound is represented by the formulae:

MOOC—R                                       Formula 2a or

$(MOOC)_n$—R                                 Formula 2b

In each of Formula 2a and 2b, O is oxygen, C is carbon and M, R and n are defined as above.

In one embodiment, referring to Formula 2a or 2b, M is sodium or potassium and R is an alkyl group, preferably a $C_1$ to $C_{40}$ alkyl group, a $C_1$ to $C_{20}$ alkyl group or a $C_1$ to $C_6$ alkyl group.

In another embodiment, the alkali metal containing carboxylate is a saturated, unsaturated, aliphatic, aromatic or saturated cyclic carboxylic acid salt where the carboxylate group has preferably from 2 to 24 carbon atoms, such as for example acetate, propionate, butyrate, valerate, pivalate, caproate, isobutylacetate, t-butyl-acetate, caprylate, heptanoate, pelargonate, undecanoate, oleate, octoate, palmitate, myristate, margarate, stearate, arachidonate and tricosanoate.

In one embodiment, the alkali metal containing compound is an alkali metal halide; preferably the halide is chloride, bromide or iodide. More preferably the alkali metal halide is LiCl, NaCl or KCl.

In another embodiment the alkali metal containing compound is an alkali metal borate, bicarbonate, carbonate, chlorate, nitrate, phosphate, sulfate, sulfide, sulfite, polysulfide or thiocyanate, silicate, aluminate, phosphonate, sulfonate, cyanate, thiolate, thiophenoxide, thiocarboxylate, thiophosphate, imide salt, or similar alkali metal salt.

In another embodiment, the alkali metal containing compound is an alkali metal ion complexed with coordinating compounds such as with crown ethers, cryptands, aza-crowns, polyglycols, or compounds containing two or more ketone or aldehyde groups.

The alkali metal containing accelerator compounds of the invention may be used alone, in combination with each other, or in combination with other accelerator compounds known in the art. Other known general classes of accelerator compounds include, but are not limited to phosphine compounds, phosphonium salts, imidazoles, imidazolium salts, amines, ammonium salts, and diazabicyclo compounds as well as their tetraphenylborates salts, phenol salts and phenol novolac salts. Examples of suitable accelerator compounds to be used in combination with the accelerator compound of the invention also include those compounds listed in U.S. Pat. No. 6,255,365, incorporated herein by reference.

Resin Compositions

In the resin compositions of the invention, the epoxy resin, curing agent, and alkali metal containing accelerator compound may optionally be dissolved in a solvent. Preferably the concentration of solids in the solvent is at least about 50 percent and no more than about 80 percent solids. Non-limiting examples of suitable solvents include ketones, alcohols, water, glycol ethers, aromatic hydrocarbons and mixtures thereof. Preferred solvents include acetone, methyl ethyl ketone, methyl isobutyl ketone, cyclohexanone, methylpyrrolidinone, propylene glycol monomethyl ether, ethylene glycol monomethyl ether, methyl amyl ketone, methanol, isopropanol, toluene, xylene, dimethylformamide (DMF) and the like. A single solvent may be used, but also separate solvents may be used for one or more components. Preferred solvents for the epoxy resins are ketones, including acetone, methylethyl ketone and the like. Preferred solvents for the curing agents include, for example, ketones, amides such as dimethylformamide (DMF), ether alcohols such as methyl, ethyl, propyl or butyl ethers of ethylene glycol, diethylene glycol, propylene glycol or dipropylene glycol, ethylene glycol monomethyl ether, or 1-methoxy-2-propanol. Preferred solvents for the accelerators of the invention include alcohols, ketones, water, dimethylformamide (DMF), glycol ethers such as propylene glycol monomethyl ether or ethylene glycol monomethyl ether, and combinations thereof.

The amount of accelerator utilized is an amount effective to catalyze the reaction of the epoxy resin with the curing agent. As is known in the art, the amount of accelerator to be utilized depends upon the components utilized in the compositions, the processing requirements, and the performance targets of the articles to be manufactured. In one embodiment the accelerator of the invention is utilized in the range of 0.00001 to 0.1 and preferably in the range of 0.0002 to 0.02 molar equivalents per 100 grams of epoxy resin solids. In another embodiment, the accelerator of the invention is utilized in an amount greater than 0.00001 molar equivalents per 100 grams of epoxy resin solids. For purposes herein molar equivalents of the accelerator relate to the alkali metal functionality. For example, sodium hydroxide and sodium chloride are monofunctional and the dialkali metal salt of bisphenol A would be difunctional.

The resin compositions of the invention may also include optional constituents such as inorganic fillers and additional flame retardants, for example antimony oxide, octabromodiphenyl oxide, decabromodiphenyl oxide, and other such constituents as is known in the art including, but not limited to, dyes, pigments, surfactants, flow control agents and the like.

In one embodiment, the resin composition of the invention includes: (1) an epoxy resin, prepared from the reaction of an epihalohydrin and a phenol or a phenol type compound, as described above, which is preferably a brominated epoxy resin; (2) an alkali metal containing cure accelerator represented by Formula 1 a where M is lithium, sodium or potassium, preferably sodium or potassium, and R is hydrogen or a $C_1$ to $C_{12}$ hydrocarbyl group, preferably a methyl, ethyl, or phenyl group and more preferably a methyl group; and (3) a curing agent. Preferably, in this embodiment, the alkali metal containing cure accelerator is selected from sodium hydroxide, potassium hydroxide, lithium hydroxide, sodium methoxide, potassium methoxide, lithium methoxide, and combinations thereof.

In one embodiment, the resin composition of the invention includes: (1) an epoxy resin, prepared from the reaction of an epihalohydrin and a phenol or a phenol type compound, as described above, which is preferably a brominated epoxy resin; (2) an alkali metal containing cure accelerator that is an alkali metal carboxylate represented by Formula 2a where M is lithium, sodium or potassium, preferably sodium or potassium, and R is hydrogen or a $C_1$ to $C_{20}$ alkyl group; and (3) a curing agent.

In one embodiment, the resin composition of the invention includes: (1) an epoxy resin, prepared from the reaction of an epihalohydrin and a phenol or a phenol type compound, as described above, which is preferably a brominated epoxy resin; (2) an alkali metal containing compound which is an alkali metal ion complexed with coordinating compounds such as with crown ethers, cryptands, aza-crowns, polyglycols, or compounds containing two or more ketone or aldehyde groups.; and (3) a curing agent.

In one embodiment, the resin composition of the invention includes: (1) an epoxy resin, prepared from the reaction of an epihalohydrin and an phenol or a phenol type compound, as described above, and is preferably a brominated epoxy resin; (2) an alkali metal containing cure accelerator that is an alkali metal halide, carbonate, bicarbonate, acetate, nitrate, sulfate, sulfite, chlorate, or thiocyanate where the alkali metal is lithium, sodium or potassium, preferably sodium or potassium; and (3) a curing agent.

Resin compositions prepared utilizing the epoxy resin cure accelerators of the invention may be impregnated upon a reinforcing material to make laminates, such as electrical laminates. The reinforcing materials which may be coated with the compositions of this invention include any material which would be used by one skilled in the art in the formation of composites, prepregs, laminates and the like. Examples of appropriate substrates include fiber-containing materials such as woven cloth, mesh, mat, fibers, and the like, and unwoven aramid reinforcements such as those sold under the trademark THERMOUNT, available from DuPont, Wilmington, Del. Preferably, such materials are made from glass, fiberglass, quartz, paper, which may be cellulosic or synthetic, a thermoplastic resin substrate such as aramid reinforcements, polyethylene, poly(p-phenyleneterephthalamide), polyester, polytetrafluoroethylene and poly(p-phenylenebenzobisthiazole),carbon, graphite, ceramic or metal and the like. Preferred materials include glass or fiberglass, in woven cloth or mat form.

Compositions containing the alkali metal containing accelerators of the invention may be contacted with an article by any method known to those skilled in the art. Examples of such contacting methods include powder coating, spray coating, die coating, roll coating, resin infusion process, and contacting the article with a bath containing the composition. In a preferred embodiment the article is contacted with the composition in a varnish bath.

In one embodiment, the reinforcing material is contacted with a varnish bath comprising the epoxy resin composition of the invention dissolved and intimately admixed in a solvent or a mixture of solvents. The coating occurs under conditions such that the reinforcing material is coated with the epoxy resin composition. Thereafter the coated reinforcing materials are passed through a heated zone at a temperature sufficient to cause the solvents to evaporate, but below the temperature at which the resin composition undergoes significant cure during the residence time in the heated zone.

The reinforcing material preferably has a residence time in the bath of from 1 second to 300 seconds, more preferably from 1 second to 120 seconds, and most preferably from 1 second to 30 seconds. The temperature of such bath is preferably from 0° C. to 100° C., more preferably from 10° C. to 40° C. and most preferably from 15° C. to 30° C. The residence time of the coated reinforcing material in the heated zone is from 0.1 to 15 min, more preferably from 0.5 to 10 min, and most preferably from 1 to 5 min.

The temperature of such zone is sufficient to cause any solvents remaining to volatilize away yet not so high as to result in a complete curing of the components during the residence time. Preferable temperatures of such zone are from 80° C. to 250° C., more preferably from 100° C. to 225° C., and most preferably from 150° C. to 210° C. Preferably there is a means in the heated zone to remove the solvent, either by passing an inert gas through the oven, or drawing a slight vacuum on the oven. In many embodiments the coated materials are exposed to zones of increasing temperature. The first zones are designed to cause the solvent to volatilize so it can be removed. The later zones are designed to result in partial cure of the polyepoxide (B-staging).

One or more sheets of prepreg are preferably processed into laminates optionally with one or more sheets of electrically-conductive material such as copper. In such further processing, one or more segments or parts of the coated reinforcing material are brought in contact with one another and/or the conductive material. Thereafter, the contacted parts are exposed to elevated pressures and temperatures sufficient to cause the epoxy resin to cure wherein the resin on adjacent parts react to form a continuous epoxy resin matrix between and about the reinforcing material. Before being cured the parts may be cut and stacked or folded and stacked into a part of desired shape and thickness. The pressures used can be anywhere from about 1 to about 1000 psi with from about 10 to about 800 psi being preferred. The temperature used to cure the resin in the parts or laminates, depends upon the particular residence time, pressure used, and resin used. Preferred temperatures which may be used are between about 100° C. and about 250° C., more preferably between about 120° C. and about 220° C., and most preferably between about 150° C. and about 190° C. The residence times are preferably from about 10 min to about 120 min, more preferably from about 20 to about 90 min, and most preferably from about 30 to about 50 min.

In one embodiment, the process is a continuous process where the reinforcing material is taken from the oven and appropriately arranged into the desired shape and thickness and pressed at very high temperatures for short times. In particular such high temperatures are from about 180° C. to about 250° C., more preferably about 190° C. to about 210° C., at times of about 1 to about 10 min and from about 2 to about 5 min. Such high speed pressing allows for the more efficient utilization of processing equipment. In such embodiments the preferred reinforcing material is a glass web or woven cloth.

In some embodiments it is desirable to subject the laminate or final product to a post cure outside of the press. This step is designed to complete the curing reaction. The post cure is usually performed at from 130° C. to 220° C. for from 20 to 200 minutes. This post cure step may be performed in a vacuum to remove any components which may volatilize.

The resin compositions of the invention, due to their thermal properties, are especially useful in thee preparation of articles for high temperature continuous use applications. Examples include electrical laminates and electrical encapsulation. Other examples include molding powders, coatings, structural composite parts and gaskets.

The epoxy resin compositions described herein may be found in various forms. In particular, the various compositions described may be found in powder form, hot melt, or alternatively in solution or dispersion. In those embodiments where the various compositions are in solution or dispersion, the various components of the composition may be dissolved or dispersed in the same solvent or may be separately dissolved in a solvent or solvents suitable for that component, then the various solutions are combined and mixed. In those embodiments wherein the compositions are partially cured or advanced, the compositions of this invention may be found in a powder form, solution form, or coated on a particular substrate.

The laminates prepared utilizing the cost effective alkali metal containing accelerators of the invention exhibit enhanced thermal properties when compared to laminates utilizing prior art accelerators, such as for example imidazoles. In another embodiment, laminates prepared utilizing the accelerators of the invention exhibit enhanced thermal properties, such as delamination time, delamination temperature, solder resistance and/or thermal degradation temperature, while maintaining a glass transition temperature (Tg) similar to laminates utilizing prior art accelerators, such as, for example, imidazoles. In another embodiment, in addition to the above, the Tg is maintained in ° C., measured by differential scanning calorimetry at a heating rate of 20° C./min, of at least 90% of that for comparable systems prepared utilizing imidazole accelerators. As utilized herein, Tg refers to the glass transition temperature of the thermosettable resin composition in its current cure state. As the prepreg is exposed to heat, the resin undergoes further cure and its Tg increases, requiring a corresponding increase in the curing temperature to which the prepreg is exposed. The ultimate, or maximum, Tg of the resin is the point at which essentially complete chemical reaction has been achieved. "Essentially complete" reaction of the resin has been achieved when no further reaction exotherm is observed by differential scanning calorimetry (DSC) upon heating of the resin.

The time to delamination of laminates prepared utilizing the alkali metal containing accelerators of the invention as measured with a thermomechanical analyzer at a heating rate of 10° C./min to 260° C. ($T_{260}$) increases by at least 10%, preferably at least 20%, more preferably at least 50% relative to the delamination time for laminates manufactured utilizing imidazole accelerators, or the delamination time at 288° C. ($T_{288}$) increases by at least 5%, preferably at least 20%, more preferably at least 100% relative to the delamination time when compared to laminates manufactured utilizing imidazole accelerators, or the delamination time at 350° C. ($T_{350}$) increases by at least 2%, preferably at least 10% relative to the delamination time when compared to laminates manufactured utilizing imidazole accelerators.

In addition, and referring to the Examples, when compared to prior art formulations containing imidazoles, such as 2-methyl imidazole, the laminates from the compositions of the invention also show measurable improvement in the thermal properties of solder float resistance, the time to sudden and irreversible delamination (constant temperature and constant heat rate test conditions), and/or the temperature at which 5% of the sample weight is lost upon heating.

In addition to enhanced thermal properties, and again referring to the Examples, the non-thermal properties of the laminates prepared from the compositions of the invention, such as water absorption, a copper peel strength, dielectric constant, and dissipation factor are comparable with those of prior art formulations utilizing an imidazole accelerator.

In order to provide a better understanding of the present invention including representative advantages thereof, the following examples are offered.

EXAMPLES

Epoxy resin formulations were prepared by dissolving the individual resin, curing agent, and accelerator components in suitable solvents at room temperature and mixing the solutions. Varnish gel times were measured with a hot plate at 171° C. using a test method similar to IPC-TM-650 Number 2.3.18. Prepregs were prepared by coating the accelerated resin varnish on style 7628 glass cloth (BGF 643 finish) and drying in a laboratory convection oven at 163° C. for 2-10 minutes to evaporate the solvents and advance the reacting epoxy/curing agent mixture to a non-tacky B-stage.

Laminates were prepared using 1-8 prepreg plies sandwiched between sheets of copper foil (Gould JTC, 1 ounce/ft$^2$) and pressing at 100 psi with the following cure cycle: (1) heat from room temperature to 350° F. at 10° F./min, (2) hold for 60 minutes, and (3) cool at 20° F./min to 100° F. Prepreg resin flow during lamination was calculated for 4-ply, 4-inch square laminates as the percent laminate weight decrease due to the flow of resin out the laminate edge, similar to IPC-TM-650 Number 2.3.17. In general, prepreg resin flow values of 10-15% were targeted.

Laminate glass transition temperatures (Tg) were measured by differential scanning calorimetry (DSC) at a heating rate of 20° C./min. Time to delamination measurements were performed at 260, 288, or 350° C. with a thermomechanical analyzer (TMA) by heating copper clad samples at 110° C./min to the desired temperature and holding the samples at that temperature until a sudden and irreversible delamination occurred (in accordance with IPC-TM-650 Number 2.4.24.1). Similarly, TMA delamination temperatures were measured by heating copper clad samples at 110° C./min until a sudden and irreversible delamination occurred. A third method used to quantify thermal stability was to measure the temperature at which a laminate sample lost a specified weight fraction, 5% in this case. This test was performed on samples without the copper cladding using a thermogravimetric analyzer (TGA) with an air environment and a heating rate of 110° C./min.

Other laminate properties measured were water absorption (IPC-TM-650 Number 2.6.2.1 and 2.6.16), copper peel strength (IPC-TM-650 Number 2.4.8 Condition A), dielectric constant (permittivity) and dissipation factor (loss factor) (IPC-TM-650 Number 2.5.5.2), and solder float resistance at 288 and 300° C. as measured by the time to delamination (similar to IPC-TM-650 Number 2.4.13.1). This latter test was only performed on single ply laminates.

Several different resin and curing agent systems were tested to verify the performance increase provided by the invention presented here and these systems are summarized by the following examples. However, one skilled in the art would expect the present invention to provide improved performance for similar resin and curing agent systems.

Example 1

Varnish formulations typical of conventional FR-4 laminate systems were prepared with 125 parts by weight (pbw) of an 80% solution of a brominated epoxy resin (the reaction product of diglycidyl ether of bisphenol A and tetrabromobisphenol A, such as EPON Resin 1124-A-80 (available from Resolution Performance Products LLC, Houston, Tex.) 28 parts of a 10% by weight solution of dicyandiamide dissolved in dimethylformamide, and 18 parts of acetone. To the varnishes were added one of the following accelerator solutions: (1) 0.9 parts of a 10% by weight solution of 2-methylimidazole (2-MI) dissolved in propylene glycol monomethyl ether or (2) 0.45 parts of a 10% solution of sodium hydroxide (NaOH) dissolved in ethylene glycol monomethyl ether. Prepregs and 8-ply laminates (12 in.×12 in.) were prepared as described above. The resulting laminates were tested as reported in Table 1.

TABLE 1

Effects of Sodium Hydroxide Accelerator on FR-4 Laminate Performance

| Property | Comp 1-1 | 1-2 |
|---|---|---|
| Accelerator Component | 2-MI | NaOH |
| Accelerator Level, 10% in solvent (pbw) | 0.9 | 0.45 |
| Varnish Gel Time (seconds at 171° C.) | 172 | 193 |
| Laminate Thickness (mm) | 1.5 | 1.4 |
| Laminate Tg (° C.) | 139 | 136 |
| T-260 Time to Delamination (minutes) | 18 | 24 |
| TMA Delamination Temperature (° C.) | 304 | 312 |
| TGA, 5% Weight Loss in Air (° C.) | 310 | 316 |
| Solder Float, Time to Delamination at 288° C. (sec) | 192 | 229 |
| Moisture Absorption, 24 Hours at 23° C. (wt. %) | 0.15 | 0.10 |
| Moisture Absorption, 1 Hour in 15 psi steam (wt. %) | 0.39 | 0.39 |
| Copper Peel Strength (lbs/in) | 11.3 | 11.2 |
| Dielectric Constant at 1 MHz, 23° C. | 4.8 | 4.7 |
| Dissipation Factor at 1 MHz, 23° C. | 0.014 | 0.014 |

Comparative system 1-1 represents the state of technology today for FR-4 laminates, namely a brominated BPA epoxy resin cured with dicyandiamide and accelerated with an imidazole compound. Replacing the imidazole accelerator in the comparative system with sodium hydroxide provided increased thermal resistance (as indicated by improvements in delamination time at 260° C., TMA delamination temperature, 5% weight loss temperature, and solder float resistance) without sacrificing general laminate performance (Tg, moisture resistance, copper peel, and electrical properties).

Example 2

Varnish formulations typical of conventional FR-4 laminate systems were prepared with 125 parts by weight of an 80% solution of a brominated epoxy resin (the reaction product of diglycidyl ether of bisphenol A and tetrabromobisphenol A, such as EPON Resin 1124-A-80), 28 or 30 parts of a 10% by weight solution of dicyandiamide dissolved in dimethylformamide, and 12-20 parts of acetone. To the varnishes were added one of the following accelerator solutions: (1) a 10% by weight solution of 2-methylimidazole dissolved in propylene glycol monomethyl ether or (2) a 10% by weight solution of potassium hydroxide (KOH) dissolved in ethylene glycol monomethyl ether. Prepregs and 4-ply laminates were prepared as described above. The resulting laminates were tested as reported in Table 2.

TABLE 2

Effects of Potassium Hydroxide Accelerator on FR-4 Brominated Resin Performance

| Property | Comp 2-1 | 2-2 | Comp 2-3 | 2-4 |
|---|---|---|---|---|
| Accelerator Component | 2-MI | KOH | 2-MI | KOH |
| Accelerator Level, 10% in solvent (pbw) | 1.0 | 1.0 | 1.0 | 0.85 |
| Dicyandiamide, 10% in DMF (pbw) | 28 | 28 | 30 | 30 |
| Varnish Gel Time (seconds at 171° C.) | 190 | 189 | 164 | 167 |
| Prepreg Resin Flow (wt. %) | 11 | 8 | 9 | 9 |
| Laminate Tg (° C.) | 136 | 136 | 138 | 135 |
| T-260 Time to Delamination (minutes) | 13 | 17 | 16 | 19 |

Replacing the imidazole accelerator in both comparative formulations with potassium hydroxide gave increased thermal resistance as measured by delamination time at 260° C. while maintaining comparable laminate glass transition temperature.

Example 3

Varnish formulations typical of conventional FR-4 laminate systems were prepared with 125 parts by weight of an 80% solution of a brominated epoxy resin (the reaction product of diglycidyl ether of bisphenol A and tetrabromobisphenol A, such as EPON Resin 1124-A-80), 28 parts of a 10% by weight solution of dicyandiamide dissolved in dimethylformamide, and 14-22 parts of acetone. To the varnishes were added one of the following accelerator solutions: (1) 0.8 parts of a 10% by weight solution of lithium hydroxide (LiOH) dissolved in a 54/46 by weight blend of methanol and water, (2) 1.4 parts of a 10% by weight solution of potassium methoxide ($KOCH_3$) dissolved in methanol, (3) 7.0 parts of a 10% by weight solution of DABCO® T-45 (a 60% solution of potassium 2-ethylhexanoate in a glycol mixture from Air Products) dissolved in ethylene glycol monomethyl ether, or (4) 1.0 parts of a 10% by weight solution of lithium chloride (LiCl) dissolved in methanol. Prepregs and 4-ply laminates were prepared as described above. The resulting laminates were tested as reported in Table 3.

TABLE 3

Effects of Various Accelerators on FR-4 Brominated Resin Performance

| Property | 3-1 | 3-2 | 3-3 | 3-4 |
|---|---|---|---|---|
| Accelerator Component | LiOH | $KOCH_3$ | DABCO T-45 | LiCl |
| Accelerator, 10% in solvent (pbw) | 0.8 | 1.4 | 7.0 | 1.0 |
| Varnish Gel Time (seconds at 171° C.) | 180 | 176 | 145 | 192 |
| Prepreg Resin Flow (wt. %) | 16 | 8 | 2 | 10 |
| Laminate Tg (° C.) | 136 | 134 | 132 | 129 |
| T-260 Time to Delamination (min) | 18 | 23 | 16 | 16 |

Relative to the comparative formulation (System 2-1), all of the systems in Table 3 provide increased thermal resistance as measured by delamination time at 260° C., with the formulations accelerated by lithium hydroxide and potassium methoxide providing comparable laminate Tg values to that of the control.

Example 4

Varnish formulations typical of a high Tg, FR-4 laminate system were prepared with 118 parts by weight of an 85% solution of a high Tg, brominated epoxy resin (an epoxy-terminated polymer with oxazolidone, bisphenol A, and tetrabromobisphenol A backbone character and with an epoxide equivalent weight of 310 g/eq), 27 parts of a 10% by weight solution of dicyandiamide dissolved in dimethylformamide, and 0-6 parts by weight of acetone. To the varnishes were added one of the following accelerator solutions: (1) 6.0 parts of a 10% by weight solution of 2-methylimidazole dissolved in propylene glycol monomethyl ether, (2) 4.6 parts of a 10% by weight solution of sodium hydroxide dissolved in ethylene glycol monomethyl ether, (3) 6.0 parts of a 10% by weight solution of potassium hydroxide dissolved in ethylene glycol monomethyl ether, or (4) a combination of 2.0 parts of a 10% by weight solution of 2-methylimidazole dissolved in propylene glycol monomethyl ether and 3.7 parts of a 10% solution of potassium hydroxide dissolved in ethylene glycol monomethyl ether. Prepregs and 4-ply laminates were prepared as described above. The resulting laminates were tested as reported in Table 4.

TABLE 4

Effects of Hydroxide Accelerators on the Performance of a High Tg Brominated Resin

| Component | Comp 4-1 | 4-2 | 4-3 | 4-4 |
|---|---|---|---|---|
| Accelerator | 2-MI | NaOH | KOH | 2-MI + KOH |
| Accelerator, 10% in solvent (phr) | 6.0 | 4.6 | 6.0 | 2.0 + 3.7 |
| Varnish Gel Time (seconds at 171° C.) | 197 | 209 | 190 | 222 |
| Prepreg Resin Flow (wt. %) | 14 | 12 | 4 | 13 |
| Laminate Tg (° C.) | 177 | 173 | 176 | 179 |
| T-260 Time to Delamination (min) | 4 | 11 | 9 | 8 |

Relative to the comparative system 4-1, replacing all or part of the imidazole accelerator with an alkali metal hydroxide accelerator as shown in Table 4 resulted in an increase in thermal resistance while maintaining comparable laminate Tg.

Example 5

Varnish formulations were prepared with 51 parts by weight of a diglycidyl ether of bisphenol A (epoxide equivalent weight of 187 g/eq), 35 parts by weight tetrabromobisphenol A, 14 parts by weight of a phenol novolac (number average molecular weight of 750 g/mol), 24-26 parts by weight of acetone, and 17-18 parts by weight of methyl ethyl ketone. Similar to Example 1, this varnish formulation is representative of some commercial systems used for FR-4 laminate applications, especially those offering improved laminate thermal resistance. To the varnish formulations were added one of the following accelerator solutions: (1) 1.2 parts of a 10% by weight solution of 2-methylimidazole dissolved in propylene glycol monomethyl ether or (2) 3.6 parts of a 10% solution of potassium methoxide dissolved in methanol.

Prepregs and 8-ply laminates (12 in. by 12 in.) were prepared as described above. The resulting laminates were tested as reported in Table 5.

TABLE 5

Effects of Potassium Methoxide Accelerator on FR-4 Laminate Performance

| Property | Comp 5-1 | 5-2 |
|---|---|---|
| Accelerator Component | 2-MI | KOCH$_3$ |
| Accelerator Level, 10% in solvent (pbw) | 1.2 | 3.6 |
| Varnish Gel Time (seconds at 171° C.) | 180 | 195 |
| Laminate Thickness (mm) | 1.5 | 1.5 |
| Laminate Tg (° C.) | 138 | 141 |
| T-288 Time to Delamination (minutes) | 18 | 84 |
| TMA Delamination Temperature (° C.) | 334 | 360 |
| TGA, 5% Weight Loss in Air (° C.) | 338 | 359 |
| Solder Float, Time to Delamination at 288° C. (min) | 11 | >19 |
| Solder Float, Time to Delamination at 300° C. (min) | 5 | >30 |
| Moisture Absorption, 24 Hours at 23° C. (wt. %) | 0.10 | 0.11 |
| Moisture Absorption, 1 Hour in 15 psi steam (wt. %) | 0.21 | 0.36 |
| Copper Peel Strength (lbs/in) | 9.8 | 9.5 |
| Dielectric Constant at 1 MHz, 23° C. | 4.9 | 4.9 |
| Dissipation Factor at 1 MHz, 23° C. | 0.014 | 0.013 |

While the comparative system 5-1 provides excellent thermal resistance, the performance is further improved by replacing the imidazole accelerator with potassium hydroxide. Relative to System 5-1, System 5-2 provides significantly increased thermal resistance (as indicated by improvements in delamination time at 288° C., TMA delamination temperature, 5% weight loss temperature, and solder float resistance) without sacrificing general laminate performance (Tg, moisture resistance, copper peel, and electrical properties). This result demonstrates application of the invention to curing agents with phenolic hydroxyl moieties.

Example 6

Varnish formulations were prepared with 51 parts by weight of a diglycidyl ether of bisphenol A (epoxide equivalent weight of 187 g/eq), 35 parts by weight tetrabromobisphenol A, 14 parts by weight of a phenol novolac (number average molecular weight of 750 g/mol), 5-10 parts by weight of acetone, and 35-43 parts by weight of methyl ethyl ketone. To the varnishes were added one of the following accelerator solutions: (1) 1.2 parts of a 10% by weight solution of 2-methylimidazole dissolved in propylene glycol monomethyl ether, (2) 3.6 parts of a 10% solution of potassium methoxide dissolved in methanol, (3) 2.9 parts of a 10% solution of potassium hydroxide dissolved in ethylene glycol monomethyl ether, (4) 5.5 parts of a 20% solution of DABCO T-45 dissolved in ethylene glycol monomethyl ether, or (5) 4.0 parts of a 10% solution of sodium carbonate ($Na_2CO_3$) dissolved in water. Prepregs and 4-ply laminates were prepared as previously described. The resulting laminates were tested as reported in Table 6.

TABLE 6

Effects of Various Accelerators on Brominated Resin Performance

| Property | Comp 6-1 | 6-2 | 6-3 | 6-4 | 6-5 |
|---|---|---|---|---|---|
| Accelerator Component | 2-MI | KOCH$_3$ | KOH | DABCO T-45 | Na$_2$CO$_3$ |
| Accelerator Level, 10% in solvent (pbw) | 1.2 | 3.6 | 2.9 | 5.5* | 4.0 |
| Varnish Gel Time (seconds at 171° C.) | 187 | 185 | 197 | 208 | 192 |
| Prepreg Resin Flow (wt. %) | 13 | 13 | 16 | 10 | 18 |
| Laminate Tg (° C.) | 136 | 139 | 136 | 134 | 137 |
| T-288 Time to Delamination (minutes) | 16 | 65 | 63 | 65 | 63 |

*20% solution by weight

Increased thermal resistance as measured by delamination time at 288° C. was obtained by replacing the imidazole accelerator typically used in the comparative formulation (System 6-1) with a variety of accelerators as listed in Table 6. In all cases, laminate Tg values were similar to the comparative formulation.

Example 7

Varnish formulations were prepared with two commercially available, brominated epoxy resin/curing agent systems used for laminating applications: (1) 125 parts by weight of EPON Resin 1213-B-80 (an 80% solids solution in methyl ethyl ketone consisting of epoxy resin and phenolic curative materials with a nominal epoxide equivalent weight of 375 g/eq, available from Resolution Performance Products LLC, Houston, Tex.) or (2) 142.9 parts by weight of EPON Custom Solution 373 (a 70% solids solution in methyl ethyl ketone and propylene glycol monomethyl ether consisting of epoxy resin and phenolic curative materials with a nominal epoxide equivalent weight of 380 g/eq, available from Resolution Performance Products LLC, Houston, Tex.). To the resin systems were added additional ketone solvents to lower the varnish viscosity and one of the following accelerator solutions: (1) a 10% by weight solution of 2-methylimidazole dissolved in propylene glycol monomethyl ether or (2) a 10% solution of potassium hydroxide dissolved in ethylene glycol monomethyl ether. Prepregs and 4-ply laminates were prepared as described above. The resulting laminates were tested as reported in Table 7.

TABLE 7

Effects of Potassium Hydroxide Accelerator on Brominated Resin Performance

| Property | Comp 7-1 | 7-2 | Comp 7-3 | 7-4 |
|---|---|---|---|---|
| Resin/Curing Agent Material | 1213 | 1213 | CS 373 | CS 373 |
| Accelerator Component | 2-MI | KOH | 2-MI | KOH |
| Accelerator Level, 10% in solvent (pbw) | 1.19 | 2.94 | 0.89 | 1.40 |
| Varnish Gel Time (seconds at 171° C.) | 189 | 182 | 122 | 116 |
| Prepreg Resin Flow (wt. %) | 17 | 17 | 11 | 9 |
| Laminate Tg (° C.) | 140 | 146 | 165 | 172 |
| T-288 Time to Delamination (minutes) | 18 | 63 | 32 | 63 |

For both the standard and high Tg, brominated resin systems, replacing the imidazole cure accelerator with potassium hydroxide gave similar processing characteristics (gel time and flow), slightly increased laminate glass transition temperature, and significantly increased thermal resistance as measured by time to delamination at 288° C.

Example 8

Varnish formulations were prepared with EPON Custom Solution 360, a commercially available, epoxy resin/curing agent system used for structural composite applications. To 125 parts by weight of EPON Custom Solution 360 (an 80% solids solution in methyl ethyl ketone consisting of epoxy resin and phenolic curative materials with a nominal weight per epoxide of 310 g/eq, available from Resolution Performance Products LLC, Houston, Tex.) were added 15 parts by weight of methyl ethyl ketone, 10 parts by weight of propylene glycol monomethyl ether, and one of the following accelerator solutions: (1) 1.2 parts of a 10% by weight solution of 2-methylimidazole dissolved in propylene glycol monomethyl ether or (2) 1.8 parts of a 10% solution of potassium hydroxide dissolved in ethylene glycol monomethyl ether. Prepregs and 4-ply laminates were prepared as described above. The resulting laminates were tested as reported in Table 8.

TABLE 8

Effects of Potassium Hydroxide Accelerator on Structural Resin Performance

| Property | Comp 8-1 | 8-2 |
|---|---|---|
| Accelerator Component | 2-MI | KOH |
| Accelerator Level, 10% in solvent (pbw) | 1.2 | 1.8 |
| Varnish Gel Time (seconds at 171° C.) | 123 | 126 |
| Prepreg Resin Flow (wt. %) | 13 | 16 |
| Laminate Tg (° C.) | 164 | 167 |
| T-350 Time to Delamination (minutes) | 51 | 65 |

As has been demonstrated for a variety of resin and curing agent systems, replacing the 2-methylimidazole cure accelerator with potassium hydroxide resulted in similar formulation processing behavior, similar laminate Tg, and an increase in thermal resistance as measured by the delamination time at 350° C.

Example 9

As taught by U.S. Pat. No. 4,251,594, a brominated resin was prepared by reacting 53.92 parts by weight of a diglycidyl ether of bisphenol A (epoxide equivalent weight of 187 g/eq) with 21.07 parts tetrabromobisphenol A and 0.076 parts potassium hydroxide. The resulting fusion product (epoxide equivalent weight of 355 g/eq) was dissolved in acetone to 74.5% solids.

Varnish formulations were prepared with 134.2 parts by weight of a 74.5% solution of the brominated epoxy resin described above and 30 parts of a 10% by weight solution of dicyandiamide dissolved in dimethylformamide. To the varnishes were added one of the following accelerator solutions: (1) 1.24 parts of a 10% by weight solution of 2-methylimidazole dissolved in propylene glycol monomethyl ether or (2) 1.43 parts of a 10% by weight solution of potassium hydroxide dissolved in ethylene glycol monomethyl ether. Prepregs and 4-ply laminates were prepared. The resulting laminates were tested as listed in Table 9.

TABLE 9

Effects of Potassium Hydroxide Accelerator on the Performance of a Resin Described in U.S. Pat. No. 4,251,594

| Property | Comp 9-1 | 9-2 |
| --- | --- | --- |
| Accelerator Component | 2-MI | KOH |
| Accelerator Level, 10% in solvent (pbw) | 1.24 | 1.43 |
| Varnish Gel Time (seconds at 171° C.) | 180 | 165 |
| Prepreg Resin Flow (wt. %) | 18 | 18 |
| Laminate Tg (° C.) | 140 | 143 |
| T-260 Time to Delamination (minutes) | 16 | 24 |

Replacing the imidazole accelerator in the comparative formulation with potassium hydroxide gave increased thermal resistance as measured by delamination time at 260° C. and a slight increase in laminate glass transition temperature. Thus, when used as a cure accelerator, potassium hydroxide provided increased thermal resistance even for a fusion resin prepared with potassium hydroxide as the fusion catalyst.

While the present invention has been described and illustrated by reference to particular embodiments, those of ordinary skill in the art will appreciate that the invention lends itself to variations not necessarily illustrated herein. For example, the alkali metal containing compound may be added as such or generated in-situ in the compositions of the invention. For this reason, then, reference should be made solely to the appended claims for purposes of determining the true scope of the present invention.

We claim:

1. A process for preparing a resin coated article, the process comprising contacting a substrate with an accelerated resin composition comprising a brominated epoxy resin, a curing agent, and a cure accelerator compound;
   wherein the cure accelerator compound is an alkali metal containing cure accelerator compound selected from the group consisting of an alkali metal containing hydroxide, an alkali metal containing alkoxide, an alkali metal containing phenoxide, an alkali metal containing carboxylate, an alkali metal containing halide salt, an alkali metal containing borate, an alkali metal containing bicarbonate, an alkali metal containing carbonate, an alkali metal containing chlorate, an alkali metal containing nitrate, an alkali metal containing phosphate, an alkali metal containing sulfate, an alkali metal containing sulfide, an alkali metal containing sulfite, an alkali metal containing polysulfide, an alkali metal containing thiocyanate, an alkali metal containing silicate, an alkali metal containing aluminate, an alkali metal containing phosphonate, an alkali metal containing sulfonate, an alkali metal containing cyanate, an alkali metal containing thiolate, an alkali metal containing thiophenoxide, an alkali metal containing thiocarboxylate, an alkali metal containing thiophosphate, an alkali metal containing imide salt, an alkali metal ion complexed with coordinating compounds, and combinations thereof;
   wherein the curing agent consists essentially of dicyandiamide or a melamine;
   wherein the brominated epoxy resin is derived from the reaction of an epihalohydrin and a phenol or a phenol type compound; and
   wherein the contacting occurs by a contacting method.

2. The process of claim 1 wherein the accelerated resin composition further comprises one or more solvent(s).

3. The process of claim 1 wherein the accelerated resin composition is in powder, hot melt, solution or dispersion form.

4. The process of claim 1 wherein the contacting method is selected from the group consisting of powder coating, spray coating, die coating, roll coating, resin infusion and contacting the substrate with a bath comprising the accelerated resin composition.

5. The process of claim 1 wherein the substrate comprises a material selected from the group consisting of glass, fiberglass, quartz, paper, thermoplastic resin, an unwoven aramid reinforcement, carbon, graphite, ceramic, metal and combinations thereof.

6. The process of claim 1 wherein the article is a prepreg, wherein the substrate comprises a material selected from the group consisting of glass, fiberglass, quartz, paper, thermoplastic resin, an unwoven aramid reinforcement, carbon, graphite and combinations thereof, and wherein the contacting occurs in a bath comprising the accelerated resin composition and optionally one or more solvent(s).

7. The process of claim 6 wherein the substrate is glass or fiberglass in the form of a woven cloth or a mat.

8. The process of claim 1 wherein the alkali metal containing cure accelerator compound is selected from the group consisting of an alkali metal containing hydroxide, an alkali metal containing alkoxide, an alkali metal containing phenoxide, an alkali metal containing carboxylate, an alkali metal containing halide salt, an alkali metal containing carbonate and combinations thereof.

9. The process of claim 1 wherein the cure accelerator consists essentially of an alkali metal containing compound represented by the formula MOR or $(MO)_n$—R wherein M is a metal selected from Group 1 of the Periodic Table of the Elements, O is oxygen, and R is hydrogen or a substituted or unsubstituted hydrocarbyl group.

10. The process of claim 9 wherein M is lithium, sodium or potassium, and R is hydrogen or a C1 to C40 hydrocarbyl group.

11. The process of claim 9 wherein OR represents a hydroxy, a methoxy, an ethoxy, an n-propoxy, an isopropoxy, an n-butoxy, an iso-butoxy, a sec-butoxy, a tert-butoxy, or a phenoxy group.

12. The process of claim 9 wherein the alkali metal containing compound is selected from the group consisting of lithium hydroxide, sodium hydroxide, potassium hydroxide, sodium methoxide, potassium methoxide, lithium methoxide and combinations thereof.

13. The process of claim 1 wherein the alkali metal containing cure accelerator compound is utilized in an amount greater than 0.00001 molar equivalents per 100 grams of epoxy resin solids.

14. The process of claim 1 wherein the phenol or a phenol type compound is selected from the group consisting of bisphenols, halogenated bisphenols, hydrogenated bisphenols, novolac resins, polyalkylene glycols and combinations thereof.

15. A resin coated article prepared by the process of claim 1.

16. A prepreg prepared by the process of claim 1.

17. The process of claim 1 wherein the accelerated resin composition is free of imidazole cure accelerator.

18. A process for preparing a resin coated article, the process comprising contacting a substrate with an accelerated resin composition comprising a brominated epoxy resin, a curing agent, and a cure accelerator compound;

wherein the cure accelerator compound is an alkali metal containing cure accelerator compound selected from the group consisting of an alkali metal containing hydroxide, an alkali metal containing alkoxide, an alkali metal containing phenoxide, an alkali metal containing carboxylate, an alkali metal containing halide salt, an alkali metal containing borate, an alkali metal containing bicarbonate, an alkali metal containing carbonate, an alkali metal containing chlorate, an alkali metal containing nitrate, an alkali metal containing phosphate, an alkali metal containing sulfate, an alkali metal containing sulfide, an alkali metal containing sulfite, an alkali metal containing polysulfide, an alkali metal containing thiocyanate, an alkali metal containing silicate, an alkali metal containing aluminate, an alkali metal containing phosphonate, an alkali metal containing sulfonate, an alkali metal containing cyanate, an alkali metal containing thiolate, an alkali metal containing thiophenoxide, an alkali metal containing thiocarboxylate, an alkali metal containing thiophosphate, an alkali metal containing imide salt, an alkali metal ion complexed with coordinating compounds, and combinations thereof;

wherein the curing agent consists essentially of dicyandiamide;

wherein the brominated epoxy resin is derived from the reaction of an epihalohydrin and a phenol or a phenol type compound; and wherein the phenol or phenol type compound is selected from the group consisting of dihydroxy phenols, biphenols, bisphenols, halogenated biphenols, halogenated bisphenols, hydrogenated bisphenols, alkylated biphenols, alkylated bisphenols, trisphenols, phenol-aldehyde resins, novolac resins, halogenated phenol-aldehyde novolac resins, substituted phenol-aldehyde novolac resins, phenol-hydrocarbon resins, substituted phenol-hydrocarbon resins, phenol hydroxybenzaldehyde resins, alkylated phenol-hydroxybenzaldehyde resins, hydrocarbon-phenol resins, hydrocarbon-halogenated phenol resins, hydrocarbon-alkylated phenol resins, and combinations thereof.

19. A process for preparing a resin coated article, the process comprising contacting a substrate with an accelerated resin composition consisting essentially of a brominated epoxy resin, a curing agent, and a cure accelerator compound;

wherein the cure accelerator compound is an alkali metal containing cure accelerator compound selected from the group consisting of an alkali metal containing hydroxide, an alkali metal containing alkoxide, an alkali metal containing phenoxide, an alkali metal containing carboxylate, an alkali metal containing halide salt, an alkali metal containing borate, an alkali metal containing bicarbonate, an alkali metal containing carbonate, an alkali metal containing chlorate, an alkali metal containing nitrate, an alkali metal containing phosphate, an alkali metal containing sulfate, an alkali metal containing sulfide, an alkali metal containing sulfite, an alkali metal containing polysulfide, an alkali metal containing thiocyanate, an alkali metal containing silicate, an alkali metal containing aluminate, an alkali metal containing phosphonate, an alkali metal containing sulfonate, an alkali metal containing cyanate, an alkali metal containing thiolate, an alkali metal containing thiophenoxide, an alkali metal containing thiocarboxylate, an alkali metal containing thiophosphate, an alkali metal containing imide salt, an alkali metal ion complexed with coordinating compounds, and combinations thereof;

wherein the curing agent is dicyandiamide or a melamine;

wherein the brominated epoxy resin is derived from the reaction of an epihalohydrin and a phenol or a phenol type compound; and wherein the phenol or phenol type compound is selected from the group consisting of bisphenols, halogenated bisphenols, hydrogenated bisphenols, novolac resins, and combinations thereof.

20. A process for preparing a resin coated article, the process comprising contacting a substrate with an accelerated resin composition consisting essentially of a brominated epoxy resin, a curing agent, and a cure accelerator compound;

wherein the cure accelerator compound is an alkali metal hydroxide;

wherein the curing agent is dicyandiamide;

wherein the brominated epoxy resin is derived from the reaction of an epihalohydrin and a phenol or a phenol type compound; and wherein the phenol or phenol type compound is selected from the group consisting of resorcinol, catechol, hydroquinone, biphenol, bisphenol A, bisphenol AP, bisphenol F, bisphenol K, tetrabromobisphenol A, phenol-formaldehyde novolac resins, alkyl substituted phenol-formaldehyde resins, phenol-hydroxybenzaldehyde resins, cresol-hydroxybenzaldehyde resins, dicyclopentadiene-phenol resins, dicyclopentadiene-substituted phenol resins, tetramethylbiphenol, tetramethyl-tetrabromobiphenol, tetramethyltribromobiphenol, tetrachlorobisphenol A and combinations thereof.

* * * * *